United States Patent [19]

Halstead

[11] 3,804,667

[45] Apr. 16, 1974

[54] METHOD FOR OPENING EYELET HOLES IN PRINTED CIRCUIT BOARDS

[75] Inventor: William M. Halstead, Glen Burnie, Md.

[73] Assignee: Techni-Tool, Inc., Philadelphia, Pa.

[22] Filed: Dec. 27, 1971

[21] Appl. No.: 212,365

Related U.S. Application Data

[62] Division of Ser. No. 862,165, Sept. 30, 1969, Pat. No. 3,632,972.

[52] U.S. Cl. .................. 117/212, 29/630 D, 83/171, 228/54

[51] Int. Cl. .............................................. C23c 1/00

[58] Field of Search .......... 228/51, 54; 83/171, 170; 117/212, 227; 29/630 D

[56] References Cited

UNITED STATES PATENTS

| | | | |
|---|---|---|---|
| 2,978,800 | 4/1961 | Blain | 29/630 |
| 3,576,669 | 4/1971 | Filip | 117/212 |
| 3,396,616 | 8/1968 | Wright | 83/171 |
| 3,562,009 | 2/1971 | Cranston et al. | 117/212 |

*Primary Examiner*—Alfred L. Leavitt
*Assistant Examiner*—J. Massie
*Attorney, Agent, or Firm*—Maleson, Kimmelman and Ratner

[57] ABSTRACT

A method of simultaneously opening solder plugged eyelet holes by inserting prongs into and through the holes thereby ejecting melted solder from the holes. The ejected solder surrounding but not adhering to the prongs and hardening around the holes.

5 Claims, 2 Drawing Figures

METHOD FOR OPENING EYELET HOLES IN PRINTED CIRCUIT BOARDS

This application is a division of U.S. patent application Ser. No. 862,165, filed Sept. 30, 1969, now U.S. Pat. No. 3,362,972.

BACKGROUND OF THE INVENTION

1. Field of the Invention

This invention relates to a method for opening solder plugged eyelet holes in printed circuit boards.

2. Prior Art

The eyelet holes in a printed circuit board accommodate wire leads of electrical components such as integrated circuit modules which are mounted on the board, such wire leads being arranged on the module in a row, or very often in two parallel rows, to fit into a complementally arranged row or rows of eyelet holes in the board. During installation of the module, the wire leads are inserted into the eyelet holes and soldered. When a module becomes defective or for some other reason has to be replaced, the wire leads must be unsoldered before they can be withdrawn from the eyelet holes, and when this is done, some of solder remains and hardens in the holes, thus plugging the same so that the wire leads of a replacement module cannot be inserted into the holes until the solder is removed.

It has been customary in the art to unplug the eyelet holes by the use of a solder melting tool in conjunction with a solder sucker which removed the melted solder from the holes by suction. While this procedure was generally satisfactory, it required the use of a special sucking tool and a vacuum pump not always readily available. The present invention eliminates the need for a sucking tool and vacuum pump.

SUMMARY OF THE INVENTION

A method of simultaneously opening a row of spaced solder plugged eyelet holes in a printed circuit board. Holes are contacted with substantially pointed prongs spaced apart a distance corresponding to the spacing of the holes. The solder is melted in the holes. Pressure is applied to the prongs causing the prongs to slide into and through the holes and the molten solder is ejected from the holes. The prongs are then withdrawn without pulling back molten solder into the holes thereby leaving the holes free and open.

BRIEF DESCRIPTION OF THE DRAWINGS

Referring now to the accompanying drawings in detail, FIG. 1 shows one embodiment of the tip of the invention designated generally by the reference numeral 10. The same comprises a shank 11 having a screw-threaded end portion 11*a* adapted to be connected to and heated by a conventional soldering iron, a portion of which is indicated by the dotted lines 12.

Figure 1:
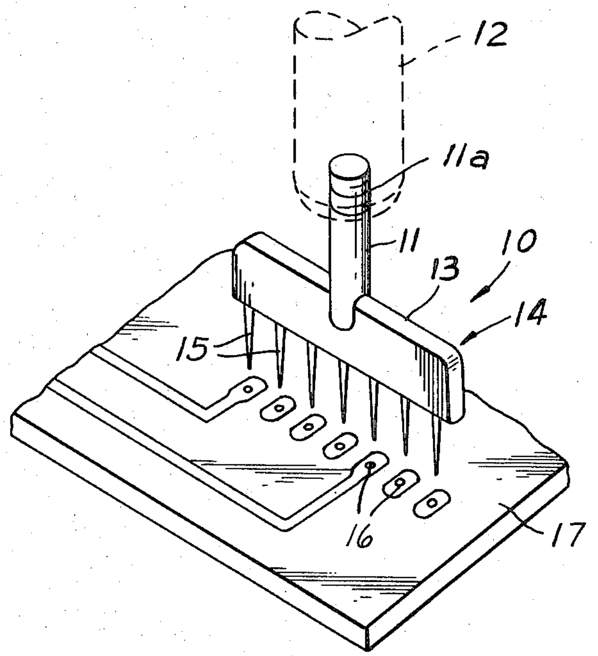
FIG. 1 is a perspective view showing one embodiment of the soldering iron tip of the invention in relation to eyelet holes in a printed circuit board.

The other end of the shank 11 is suitably secured to a rigid back bar 13 of a comb-like member 14 which also includes a row of longitudinally tapered, pointed prongs 15. The prongs 15 are preferably formed integrally with the back bar 13 from any suitable heat-conductive material to which solder does not readily adhere, as for example, stainless steel or aluminum. The prongs project from one edge of the back bar in a row disposed in a plane which is substantially parallel to the axis of the shank 11, as will be readily apparent.

When the tip of the invention is placed in use, it is attached to a soldering iron and heated to a temperature sufficient to melt solder, whereupon the pointed extremities of the prongs 15 are applied to the solder-plugged eyelet holes 16 in a printed circuit board 17. This causes the solder in the holes to melt and as the operator gradually applies pressure to the tool, the prongs 15 are caused to slide into and through the holes 16, thus ejecting the molten solder from the holes and leaving the holes free and open when the prongs are subsequently withdrawn from the board.

It is preferred to apply the tool to the side of the board 17 on which an integrated circuit module is to be installed, that is, on the side of the board opposite from that where the wire leads of the module are normally soldered, which may be referred to as the underside of the board. Thus, when the prongs 15 push the molten solder outwardly from the holes to the underside of the board and the pushed out solder surrounds the projecting prongs without adhering thereto, the prongs can be withdrawn while the pushed out solder remains and hardens in the form of rings or eyelets around the holes at the underside of the board. In other words, it is an important feature of the invention that, because the solder does not adhere to the prongs, it does not get pulled back into the holes during withdrawal of the prongs from the board, and thus the holes are left free and open while the pushed out solder remains on the underside of the board in the form of rings or eyelets surrounding the holes, in readiness for the next soldering operation when the wire leads of a replacement module are inserted into the open holes and into the rings or eyelets formed by the pushed out solder. Thus, with the solder rings or eyelets already on the underside of the board, the replacement module may be quickly soldered in place, usually without any additional solder being required for that procedure, although additional solder may be used, if desired or necessary.

Figure 2:
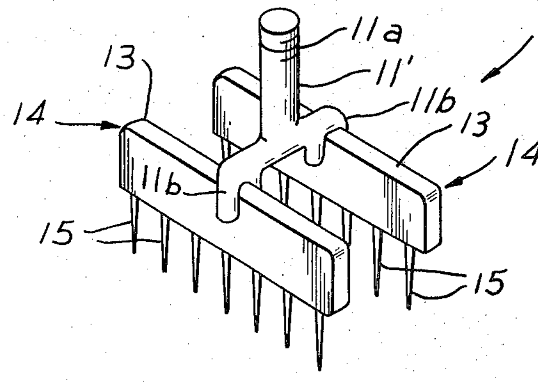
FIG. 2 is a perspective view showing a modified embodiment of the tip, utilizing two comb-like members to provide two rows of hole opening prongs.

The tool of the invention as shown in FIG. 1 utilizes a single row of prongs 15 for simultaneously opening up a corresponding single row of holes in the board 17. However, in many instances integrated circuit modules are provided with multiple rows of wire leads insertable in corresponding multiple rows of eyelet holes in the board, and since it is obviously desirable to open up all the necessary holes at the same time, a modified tip 10' shown in FIG. 2 may be used.

The tip 10' utilizes a pair of comb-like members 14, 14' of identical construction, carried by the furcations 11*b* of a bifurcated lower end portion of the shank 11', the members 14, 14' being disposed in spaced parallel juxtaposition so that their two rows of prongs 15 may be applied to two rows of holes in the board.

What is claimed is:

1. A method of simultaneously opening a row of spaced solder plugged eyelet holes in a printed circuit board comprising the steps of simultaneously contacting said holes on a first side of said board with a plurality of substantially pointed prongs to which said solder does not readily adhere spaced apart a distance corresponding to the spacing of said holes, heating and melting said solder in said holes, applying pressure simultaneously to said prongs and causing said prongs to slide into and through said holes, ejecting said molten solder from said holes, withdrawing said prongs without pulling back said molten solder into said holes and leaving said holes free and open.

2. The method of claim 1 in which there is provided, prior to the step of simultaneously contacting said holes, the further step of forming said prongs of material selected from the group consisting of stainless steel, aluminum and plated metal.

3. The method of claim 2 in which there is provided after said forming step the further step of tapering said prongs.

4. The method of claim 1 in which in said ejecting step said prongs push said molten solder outwardly from said holes to surround said prongs on a second side of said board remote from said first side.

5. The method of claim 4 in which in said withdrawing step said molten solder surrounding said prongs does not adhere to said withdrawing prongs and said molten solder remains and hardens around said holes in the form of rings.

* * * * *